(12) United States Patent
Chen

(10) Patent No.: US 11,322,053 B2
(45) Date of Patent: May 3, 2022

(54) FLEXIBLE DISPLAY SCREEN AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Xia Chen, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 185 days.

(21) Appl. No.: 16/755,788

(22) PCT Filed: Dec. 16, 2019

(86) PCT No.: PCT/CN2019/125605
§ 371 (c)(1),
(2) Date: Apr. 13, 2020

(87) PCT Pub. No.: WO2021/103195
PCT Pub. Date: Jun. 3, 2021

(65) Prior Publication Data
US 2021/0407336 A1 Dec. 30, 2021

(30) Foreign Application Priority Data

Nov. 29, 2019 (CN) .......................... 201911198235.5

(51) Int. Cl.
*G09F 9/30* (2006.01)
*H01L 27/32* (2006.01)
*H01L 51/52* (2006.01)

(52) U.S. Cl.
CPC ............ *G09F 9/301* (2013.01); *H01L 27/323* (2013.01); *H01L 51/5293* (2013.01); *H01L 2251/5338* (2013.01)

(58) Field of Classification Search
CPC ... G09F 9/301; H01L 27/323; H01L 51/5293; H01L 2251/5338
See application file for complete search history.

(56) References Cited

U.S. PATENT DOCUMENTS 11,119,534 B2 *  9/2021  Lee ........................ G06F 1/1641
11,181,947 B2 * 11/2021  de la Fuente ......... G06F 1/1624
(Continued)

*Primary Examiner* — Joe H Cheng
(74) *Attorney, Agent, or Firm* — Osha Bergman Watanabe & Burton LLP

(57) ABSTRACT

The present application provides a flexible display screen and a display device. The flexible display screen includes a display panel, at least one reel, at least one reel restoring mechanism, and a flexible layer. The reel is disposed at a side of the display panel, the reel restoring mechanism is disposed at a side of the display panel, and the reel is correspondingly set on the reel restoring mechanism. The flexible layer includes a middle portion and a side portion connected to the middle portion, the middle portion of the flexible layer covers a surface of the display panel far away from the display surface, and the side portion of the flexible layer is wound on the reel.

8 Claims, 2 Drawing Sheets

(56) References Cited

U.S. PATENT DOCUMENTS

| | | | |
|---|---|---|---|
| 2013/0010405 A1* | 1/2013 | Rothkopf | H05K 5/0226 361/679.01 |
| 2014/0380186 A1* | 12/2014 | Kim | G06F 1/1677 715/746 |
| 2016/0070303 A1* | 3/2016 | Lee | G06F 1/1641 361/679.27 |
| 2016/0085265 A1* | 3/2016 | Park | G06F 1/1616 361/807 |
| 2016/0100478 A1* | 4/2016 | Lee | G06F 1/1626 361/749 |
| 2016/0202781 A1* | 7/2016 | Kim | G06F 3/041 345/173 |
| 2016/0343969 A1* | 11/2016 | Zeng | H01L 51/0021 |
| 2016/0357221 A1* | 12/2016 | Huh | G06F 3/0488 |
| 2016/0366772 A1* | 12/2016 | Choi | G06F 1/1652 |
| 2017/0168769 A1* | 6/2017 | Jeon | G06F 1/1652 |
| 2019/0097178 A1* | 3/2019 | Cho | G02F 1/133528 |
| 2019/0297736 A1* | 9/2019 | Xu | G06F 1/1656 |
| 2020/0089369 A1* | 3/2020 | Bang | G06F 3/0448 |
| 2021/0191468 A1* | 6/2021 | Nakamura | H05B 33/02 |
| 2021/0232246 A1* | 7/2021 | Xu | G06F 3/0412 |

* cited by examiner

FLEXIBLE DISPLAY SCREEN AND DISPLAY DEVICE

CROSS-REFERENCE TO RELATED APPLICATION

This application is the National Stage of PCT/CN2019/125605 filed on Dec. 16, 2019, which claims priority under 35 U.S.C. § 119 to Chinese Application No. CN 201911198235.5 filed on Nov. 29, 2019, the disclosure of which is incorporated by reference in its entirety.

BACKGROUND OF INVENTION

Field of Invention

The present application relates to the field of display, and particularly to a flexible display screen and a display device.

Description of Prior Art

With advancement in technology, high-performance electronic products have been introduced, and lightweight, thin, flexible, and bendable consumer electronic products have attracted investment and development from major manufacturers. In order to achieve organic light emitting diode product targets, new materials, new designs and new manufacturing processes must be introduced to improve performance of flexible and bendable OLED products.

Common OLED module structure includes a glass cover plate, a touch panel, a polarizing sheet, a display panel, a back plate, and so on. When bending, because inner and outer layers have different bending radii, if the structure has no compensation design, this will cause an excessively large tensile force at a certain bending angle, which pulls a screen and leads to failure. At the same time, the film layers are mostly made of organic polymer materials, and characteristics of the materials determine that these materials easily slide and loosen during repeated bending or long-term bending, thereby leading to irreversible deformation, which is reflected on products; that is, local unevenness and waviness occur on a display surface, which seriously affects the products' look and feel as well as overall user experience.

SUMMARY OF INVENTION

The purpose of the application is to provide a flexible display screen and a display device to solve a problem of that these materials are easy to creep and relaxation during repeated bending or long-term bending, thereby leading to irreversible deformation, which cause problems such as screen damage that seriously affect the product's perception and overall use experience.

In order to get the target, the application provides a flexible display screen, the flexible display screen includes a display panel, at least one reel, at least one reel restoring mechanism and a flexible layer. The display panel includes a display surface and a bending region. The reel is disposed at a side of the display panel, an axial direction of the reel is parallel to a bending axial of the display panel. The reel restoring mechanism is disposed on a side of the display panel, the reel is correspondingly arranged to the reel restoring mechanism. The flexible layer includes a middle portion and a side portion connected to the middle portion, the middle portion of the flexible layer covers a surface of the display panel far away from the display surface, and the side portion of the flexible layer is wound around the reel.

When the display panel is bent, the side portion of the flexible layer disposed on the reel is partially drawn out. When the display panel is restored to a flat state, the reel restoring mechanism drives the reel to rotate and restore, a drawn out portion of the side portion of the flexible layer are rewound around the reel.

Further, the flexible display screen includes a shell, wherein the display panel and the reel are both disposed in the shell.

Further, the reel includes a coiling block and two bearings, wherein the side portion of the flexible layer is wound around an outer wall of the coiling block, the bearings correspondingly are disposed at two ends of the coiling block and set on the shell.

Further, the reel restoring mechanism comprises a spring disposed in the reel.

Further, the reel restoring mechanism includes a restoring hinge disposed in the reel, the restoring hinge comprises a fixed end and a rotating end, the fixed end is secured on the shell, and the rotating end and the coiling block are connected to each other.

Further, material of the flexible layer comprises alloy or organic polymer material.

Further, the display panel includes a display layer, a polarizing sheet and a touch layer. The display layer is disposed on the flexible layer. The polarizing sheet is disposed on the display layer. The touch layer is disposed on the polarizing sheet.

Further, the display panel includes a back plate and a cover plate. The back plate is disposed between the flexible layer and the display layer. The cover plate is disposed on a surface of the touch layer far away from the polarizing sheet.

Further, the display panel includes bonding layers, the bonding layers are separately disposed between the back plate and the display layer, between the display layer and the polarizing sheet, between the polarizing sheet and the touch layer, and between the touch layer and the cover plate.

The application also provides a display device, which includes the flexible display screen as the above.

The benefit of the present application is: in the flexible display screen and the display device of the application, a flexible layer is attached to a back side of the display panel and through cooperation with a reel, two ends of the flexible layer are wound around the reels. When the display panel is bent, a portion of the flexible layer wound around the reel is relaxed to compensate a length of the display panel and to prevent the display panel from being damaged by a tensile force. When the display panel is flattened, the reel employs a certain tensile force to the flexible layer to drive the display panel to be flattened, thereby relieving the problem of uneven surface after bending and improving the product's look and feel.

BRIEF DESCRIPTION OF DRAWINGS

In order to more clearly illustrate the technical solutions in the embodiments of the present invention, the drawings used in the description of the embodiments will be briefly introduced below. Obviously, the drawings in the following description are only some of the present invention. For the person skilled in the art, without drawing creative labor, other embodiments may be obtained according to these drawings.

Figure 1:
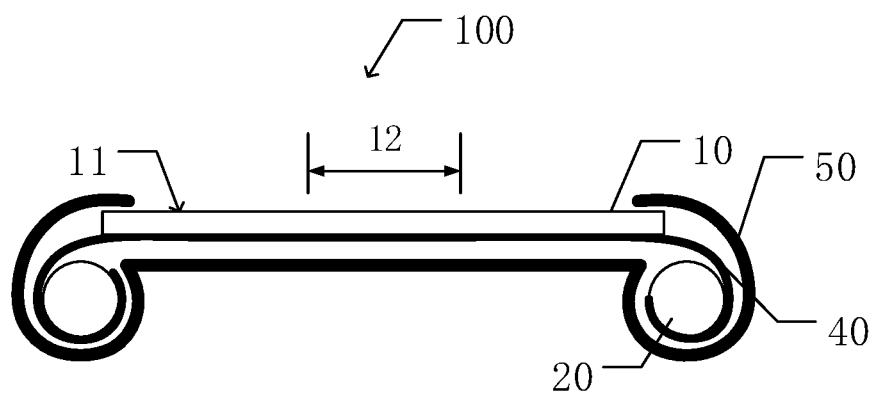
FIG. 1 is a layer structural diagram of a flexible display screen of a first and a second embodiment of the present application.

The components in the figure are as follows:
flexible display screen 100; display panel 10;
display surface 11; bending region 12;
display layer 13; polarizing sheet 14;
touch layer 15; back plate 16;
cover plate 17; bonding layer 18;
reel 20; coiling block 21;
bearings 22; reel restoring mechanism 30;
spring 31; restoring hinge 32;
fixed end 33; rotating end 34;
flexible layer 40; shell 50.

DETAILED DESCRIPTION OF PREFERRED EMBODIMENTS

The following describes the preferred embodiments of the present invention with reference to the accompanying drawings, and proves that the present invention can be implemented. The embodiments of the invention can completely introduce the present invention to those skilled in the art, making its technical content clearer and easier to understand. This The invention can be embodied by many different forms of invention embodiments, and the scope of protection of the invention is not limited to the embodiments mentioned in the text.

In the drawings, components having the same structure are denoted by the same numerals, and components having similar structures or functions are denoted by similar numerals. The size and thickness of each component shown in the drawings are arbitrarily shown. The present invention does not limit the size and thickness of each component. In order to make the illustration clearer, the thickness of the components is exaggerated in some places in the drawings.

In addition, the following description of each embodiment of the invention is with reference to additional illustrations to illustrate specific invention embodiments that can be implemented by the present invention. Directional terms mentioned in the present invention, for example, "up", "down", "front", "back", "left", "right", "inside", "outside", "side", etc., are only directions referring to the attached drawings. Therefore, the terminology used is for more To better and more clearly illustrate and understand the present invention, rather than to indicate or imply that the device or element referred to must have a specific orientation, structure and operation in a specific orientation, and therefore cannot be understood as a limitation on the present invention. In addition, the term "first", "second", "third", etc. are used for descriptive purposes only, and should not be construed to indicate or imply relative importance.

When certain parts are described as "on" another part, the part can be placed directly on the other part; there can also be an intermediate part, the part placed on the intermediate part, and the intermediate part Placed on another component. When one component is described as "installed to" or "connected to" another component, both can be understood as directly "installed" or "connected," or a component is indirectly installed "through an intermediate component", or "connected to" another part.

Embodiment 1

The embodiment of the present application provides a flexible display screen 100. Referring to FIG. 1, the flexible display screen 100 includes a display panel 10, a flexible layer 40, two reels 20, two reel restoring mechanisms 30, and a shell 50.

The display panel 10 and the reels 20 are disposed in the shell 50. A portion of the shell 50 corresponding to the bending region 12 of the display panel also can be bent, and a bending direction of the shell is same as a bending direction of the display panel 10. The shell 50 is used to protect an entire structure of the flexible display screen 100.

Figure 2:
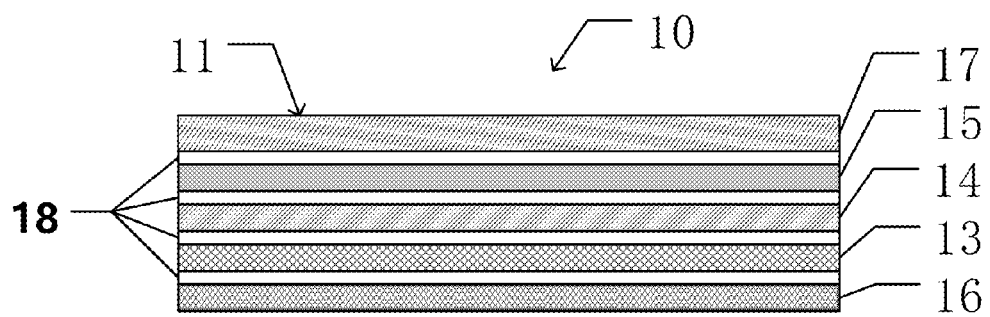
FIG. 2 is a layer structural diagram of a display panel of the first and the second embodiment of the present application.

The display panel 10 is arranged on the flexible layer 40. The display panel includes a bending region 12. In the bending region 12, the display panel 10 can realize flexible bending display. Referring to FIG. 2, the display panel 10 includes a display layer 13, a polarizing sheet 14, a touch layer 15, a back plate 16, and a cover plate 17. The back plate 16 is arranged on the flexible layer 40, and the back plate is used to protect an entire structure of the display panel 10. The display layer 13 is disposed on a surface of the back plate 16 far away from the flexible layer 40, and the display layer includes a plurality of OLED display components arranged therein, which are used to supply display light to the display panel. The polarizing sheet 14 is disposed on a surface of the display layer 13 far away from the back plate 16, and the polarizing sheet is used to employ a polarization treatment to the display light emitted by the display layer 13 to form polarized light and form a visual display picture. The touch layer 15 is disposed on a surface of the polarizing sheet 14 far away from the display layer 13, and the touch layer is used to realize touch control and realize human interaction. The cover plate 17 is disposed on a surface of the touch layer 15 far away from the polarizing sheet 14. The cover plate 17 is generally made of transparent glass, and the cover plate is used to protect the display panel 10 and does not affect the display picture. The display panel 10 includes four bonding layers 18, and the bonding layer 18 are separately disposed between the back plate 16 and the display layer 13, between the display layer 13 and the polarizing sheet 14, between the polarizing sheet 14 and the touch layer 15, and between the touch layer 15 and the cover plate 17. The bonding layers 18 are used to increase adhesive strength between the film layers and prevent problems such as film peeling.

The display panel 10 includes a display surface 11. The display surface 11 is defined as a surface of the cover plate 17 far away from the touch layer 15. The flexible layer 40 includes a middle portion and side portions connected to two sides of the middle portion. The middle portion of the flexible layer covers a surface of the display panel 10 far away from the display surface 11, and the side portions of the flexible layer are wound around the reels 20. Material of the flexible layer 40 includes flexible alloy or organic polymer material.

The reels 20 are disposed at two sides of the display panel 10, and axial directions of the reels 20 are parallel to bending axials of the display panel 10. The reels 20 include reel restoring mechanisms 30 arranged therein. When the bending regions 12 of the display panel 10 are bent, the side portions of the flexible layer wound around the reels are partially drawn out to compensate a length of the display panel 10, to prevent the display panel 10 from a large tensile force when being bent, which will cause the display panel 10 to be pulled and torn, leading to failure. When the bending regions 12 of the display panel 10 are restored to a flat state, the reel restoring mechanisms 30 apply tension forces to drive the reels 20 to rotate and restore, while drawn out portions of the side portions of the flexible layer 40 are rewound around the reels. Because the reel restoring mechanisms 30 applying tension force can help flatten the display panel 10, problems such as surface slack and unevenness of the display panel 10 after being bent are relieved, thereby increasing product's look and feel.

Figure 3:
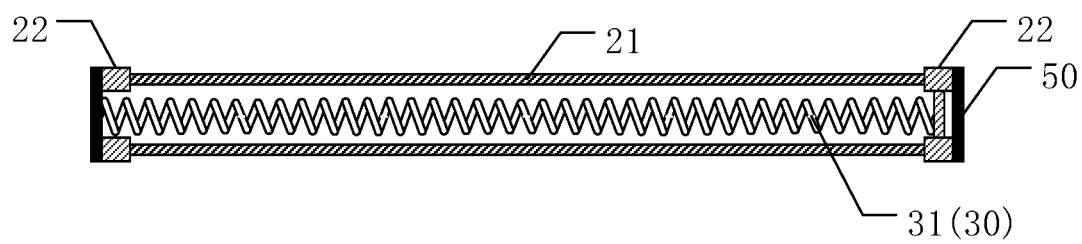
FIG. 3 is a sectional structural diagram of a reel of the first embodiment of the present application.

Referring to FIG. 3, the reel 20 includes a coiling block 21 and two bearings 22. The bearings 22 are correspondingly disposed at two inner sides of the shell 50. Two ends of the coiling block 21 are correspondingly disposed on the bearings 22. One side portion of the flexible layer 40 winds around an outer wall of the coiling block 21. When the display panel 10 is bent, a corresponding region of the flexible layer 40 is bent at the same time, and a tensile force towards to the bending region 12 is generated. The tensile force drives the reel 20 to make the side portion of the flexible layer 20 drawn out to outside of the shell 50 and compensate a length of the display panel 10, thereby preventing the display panel 10 from being torn and damaged by the tensile force.

Each reel 20 includes a reel restoring mechanism 30 disposed therein. Referring to FIG. 3, in the embodiment of the application, the reel restoring mechanism 30 is a spring 31. One end of the spring 31 is connected to the bearing 22, and another end is secured on the shell 50. When the display panel 10 is bent, the reel restoring mechanism drives the reel 20 to make the bearing 22 of the reel 20 rotate. When the bearing 22 is rotated, the spring 31 connected to the bearing is tensioned. when the display panel 10 is restored to a flat state, the opened spring 31 drives the reel 20 rewound by an elastic force to make the drawn out flexible layer 40 be rewound around the coiling block 21 of the reel 20 and straighten the flexible layer 40 to prevent wrinkles in the bending region 12.

The present application also provides a display device. The display device includes the flexible display screen 100. The display device has a folding screen display effect, which can be any product or component with a display function such as a mobile phone, a tablet computer, or a laptop computer.

The present application provides a flexible display screen 100. A flexible layer 40 is employed to compensate a length to reduce a tensile force endured by the display panel 10 when bending, thereby preventing the display panel 10 from being damaged by the stress, and improving the reliability of the product. In addition, the flexible layer 40 cooperates with the reel 20, and when the display panel 10 is flattened, the compensating length is rewound to flatten the display panel 10, thereby improving the problem of uneven surface after bending, and improving the product's look and feel.

Embodiment 2

The embodiment of the present application provides a flexible display screen 100. Referring to FIG. 1, the flexible display screen 100 includes a display panel 10, a flexible layer 40, two reels 20, two reel restoring mechanisms 30, and a shell 50.

The display panel 10 and the reels 20 are disposed in the shell 50. A portion of the shell 50 corresponding to the bending region 12 of the display panel also can be bent, and a bending direction of the shell is the same as a bending direction of the display panel 10. The shell 50 is used to protect an entire structure of the flexible display screen 100.

The display panel 10 is arranged on the flexible layer 40. The display panel includes a bending region 12. In the bending region 12, the display panel 10 can realize flexible bending display. Referring to FIG. 2, the display panel 10 includes a display layer 13, a polarizing sheet 14, a touch layer 15, a back plate 16, and a cover plate 17. The back plate 16 is arranged on the flexible layer 40, and the back plate is used to protect an entire structure of the display panel 10. The display layer 13 is disposed on a surface of the back plate 16 far away from the flexible layer 40, and the display layer includes a plurality of OLED display components arranged therein, which are used to supply display light to the display panel. The polarizing sheet 14 is disposed on a surface of the display layer 13 far away from the back plate 16, and the polarizing sheet is used to employ a polarization treatment to the display light emitted by the display layer 13 to form polarized light and form a visual display picture. The touch layer 15 is disposed on a surface of the polarizing sheet 14 far away from the display layer 13, and the touch layer is used to realize touch control and realize human interaction. The cover plate 17 is disposed on a surface of the touch layer 15 far away from the polarizing sheet 14. The cover plate 17 is generally made of transparent glass, and the cover plate is used to protect the display panel 10 and does not affect the display picture. The display panel 10 includes four bonding layers 18, and the bonding layer 18 are separately disposed between the back plate 16 and the display layer 13, between the display layer 13 and the polarizing sheet 14, between the polarizing sheet 14 and the touch layer 15, and between the touch layer 15 and the cover plate 17. The bonding layers 18 are used to increase adhesive strength between the film layers and prevent problems such as film peeling.

The display panel 10 includes a display surface 11. The display surface 11 is defined as a surface of the cover plate 17 far away from the touch layer 15. The flexible layer 40 includes a middle portion and side portions connected to two sides of the middle portion. The middle portion of the flexible layer covers a surface of the display panel 10 far away from the display surface 11, and the side portions of the flexible layer are wound around the reels 20. Material of the flexible layer 40 includes flexible alloy or organic polymer material.

The reels 20 are disposed at two sides of the display panel 10, and axial directions of the reels 20 are parallel to bending axials of the display panel 10. The reels 20 include reel restoring mechanisms 30 arranged therein. When the bending regions 12 of the display panel 10 are bent, the side portions of the flexible layer wound around the reels are partially drawn out to compensate a length of the display panel 10, to prevent the display panel 10 from a large tensile force when being bent, which will cause the display panel 10 to be pulled and torn, leading to failure. When the bending regions 12 of the display panel 10 are restored to a flat state, the reel restoring mechanisms 30 apply tension forces to drive the reels 20 to rotate and restore, while drawn out portions of the side portions of the flexible layer 40 are rewound around the reels. Because the reel restoring mechanisms 30 applying tension force can help flatten the display panel 10, problems such as surface slack and unevenness of the display panel 10 after being bent are relieved, thereby increasing product's look and feel.

Figure 4:
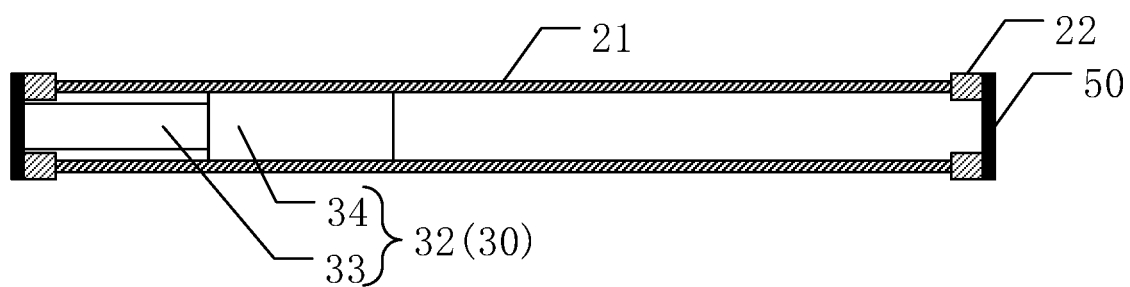
FIG. 4 is a sectional structural diagram of a reel of the second embodiment of the present application.

Referring to FIG. 4, the reel 20 includes a coiling block 21 and two bearings 22. The bearings 22 are correspondingly disposed at two inner sides of the shell 50. Two ends of the coiling block 21 are correspondingly disposed on the bearings 22. One side portion of the flexible layer 40 winds around an outer wall of the coiling block 21. When the display panel 10 is bent, a corresponding region of the flexible layer 40 is bent at the same time, and a tensile force towards to the bending region 12 is generated. The tensile force drives the reel 20 to make the side portion of the flexible layer 20 drawn out to outside of the shell 50 and compensate a length of the display panel 10, thereby preventing the display panel 10 from being torn and damaged by the tensile force.

Each reel 20 includes a reel restoring mechanism 30 disposed therein. Referring to FIG. 4, in the embodiment of the application, the reel restoring mechanism 30 is a restoring hinge 32. The restoring hinge 32 is disposed in the reel 20. The restoring hinge includes a fixed end 33 and a rotating end 34. The rotating end 34 is connected to the coiling block 21, and the fixed end 33 is secured on the shell 50. The restoring hinge includes a springback mechanism disposed therein, and the springback mechanism can drive the rotating end 34 to restore. When the display panel 10 is bent, the restoring hinge drives the reel 20 to make the bearing 22 and the coiling block 21 in the reel 20 rotate, making the rotating end 34 of the restoring hinge 32 connected to the coiling block 21 be rotated by the coiling block 21 along a same direction, making the springback mechanism disposed therein tensioned. When the display panel 10 is restored to a flat state, the tensioned springback mechanism drives the rotating end 34 to restore by a force caused by the tensioned state, while the rotating end 34 drives the coiling block 21 to restore and rotate. The drawn out flexible layer 40 is rewound on the coiling block 21 of the reel 20, and straightens the flexible layer 40 to prevent wrinkles in the bending region 12.

The present application also provides a display device, the display device includes the flexible display screen 100. The display device has a folding screen display effect, which can be any product or component with a display function such as a mobile phone, a tablet computer, or a laptop computer.

The present application provides a flexible display screen 100. A flexible layer 40 is employed to compensate a length to reduce a tensile force endured by the display panel 10 when bending, thereby preventing the display panel 10 from being damaged by the stress, and improving the reliability of the product. In addition, the flexible layer 40 cooperates with the reel 20, and when the display panel 10 is flattened, the compensating length is rewound to flatten the display panel 10, thereby improving the problem of uneven surface after bending, and improving the product's look and feel.

Although the present invention is described herein with reference to specific implementations, it should be understood that these embodiments are merely examples of the principles and applications of the present invention. It should therefore be understood that exemplary implementations may be implemented Many modifications can be made to the examples, and other arrangements can be designed, as long as they do not depart from the spirit and scope of the present invention as defined by the appended claims. It should be understood that different methods can be used to combine different. The dependent claims and the features described herein. It can also be understood that features described in connection with separate embodiments can be used in other described embodiments.

What is claimed is:

1. A flexible display screen, comprising:
    a display panel comprising a display surface and a bending region;
    at least one reel disposed at a side of the display panel, wherein an axial direction of the reel is parallel to a bending axial of the display panel;
    at least one reel restoring mechanism disposed at a side of the display panel, wherein the reel is correspondingly arranged to the reel restoring mechanism; and
    a flexible layer comprising a middle portion and a side portion connected to the middle portion, wherein the middle portion of the flexible layer covers a surface of the display panel far away from the display surface, and the side portion of the flexible layer is wound around the reel;
    wherein when the display panel is bent, the side portion of the flexible layer disposed on the reel is partially drawn out;
    wherein when the display panel is restored to a flat state, the reel restoring mechanism drives the reel to rotate and restore, and a drawn out portion of the side portion of the flexible layer is rewound around the reel;
    wherein the flexible display screen further comprises a shell, and the display panel and the reel are both disposed in the shell; and
    wherein the reel comprises:
        a coiling block, wherein the side portion of the flexible layer is wound around an outer wall of the coiling block; and
        two bearings correspondingly disposed at two ends of the coiling block and set on the shell.

2. The flexible display screen of claim 1, wherein the reel restoring mechanism comprises a spring disposed in the reel.

3. The flexible display screen of claim 1, wherein the reel restoring mechanism comprises a restoring hinge disposed in the reel, the restoring hinge comprises a fixed end and a rotating end, the fixed end is secured on the shell, and the rotating end and the coiling block are connected to each other.

4. The flexible display screen of claim 1, wherein material of the flexible layer comprises alloy or organic polymer material.

5. The flexible display screen of claim 1, wherein the display panel comprises:
    a display layer disposed on the flexible layer;
    a polarizing sheet disposed on the display layer; and
    a touch layer disposed on the polarizing sheet.

6. The flexible display screen of claim 5, wherein the display panel further comprises:
    a back plate disposed between the flexible layer and the display layer; and
    a cover plate disposed on a surface of the touch layer far away from the polarizing sheet.

7. The flexible display screen of claim 6, wherein the display panel further comprises:
    bonding layers separately disposed between the back plate and the display layer, between the display layer and the polarizing sheet, between the polarizing sheet and the touch layer, and between the touch layer and the cover plate.

8. A display device, comprising the flexible display screen of claim 1.

* * * * *